US009588497B1

United States Patent
Monk et al.

(10) Patent No.: US 9,588,497 B1
(45) Date of Patent: Mar. 7, 2017

(54) DIFFERENTIAL VOLTAGE-CONTROLLED OSCILLATOR ANALOG-TO-DIGITAL CONVERTER USING INPUT-REFERRED OFFSET

(71) Applicant: Silicon Laboratories Inc., Austin, TX (US)

(72) Inventors: Timothy A. Monk, Hudson, NH (US); Rajesh Thirugnanam, Nashua, NH (US); Douglas F. Pastorello, Nashua, NH (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/221,078

(22) Filed: Jul. 27, 2016

(51) Int. Cl.
| | |
|---|---|
| *H03M 1/50* | (2006.01) |
| *G04F 10/00* | (2006.01) |
| *H03M 1/06* | (2006.01) |
| *H03M 1/12* | (2006.01) |
| *H03M 1/10* | (2006.01) |

(52) U.S. Cl.
CPC ............ *G04F 10/005* (2013.01); *H03M 1/06* (2013.01); *H03M 1/1009* (2013.01); *H03M 1/124* (2013.01)

(58) Field of Classification Search
CPC ..... G04F 10/005; H03M 1/1009; H03M 1/06; H03M 1/124; H03M 4/458; H03M 1/0836; H03M 1/0854; H03L 7/06; H03L 7/093; H03L 7/0802
USPC .................. 341/166; 327/147–149, 156–158
See application file for complete search history.

(56) References Cited

U.S. PATENT DOCUMENTS

| | | | | |
|---|---|---|---|---|
| 8,723,566 | B1 * | 5/2014 | Mathur | ................. H03L 7/0898 327/147 |
| 8,878,577 | B2 * | 11/2014 | Waltari | ................... H03L 7/091 327/147 |
| 8,933,831 | B2 * | 1/2015 | Oshima | ............... H03M 1/0836 341/118 |
| 9,246,500 | B2 | 1/2016 | Perrott | |
| 9,270,288 | B2 | 2/2016 | Perrott | |
| 2015/0145567 | A1 | 5/2015 | Perrott | |
| 2015/0145571 | A1 | 5/2015 | Perrott | |

OTHER PUBLICATIONS

Maxim Integrated Products, "Understanding Single-Ended, Pseudo-Differential and Fully-Differential ADC Inputs," Application Note 1108, Jun. 14, 2002, pp. 1-7.

* cited by examiner

*Primary Examiner* — Khai M Nguyen
(74) *Attorney, Agent, or Firm* — Zagorin Cave LLP

(57) ABSTRACT

A feedback loop includes an oscillator-based analog-to-digital converter configured to convert an analog signal to a first digital value and a second digital value. The oscillator-based analog-to-digital converter includes a first oscillator having a first oscillation frequency configured to generate a first digital value based on a first signal component of the analog signal. The oscillator-based analog-to-digital converter includes a second oscillator having a second oscillation frequency configured to generate a second digital value based on a second signal component of the analog signal. The first and second signal components are complementary signal components. The feedback loop includes a combiner configured to generate a digital value based on the first digital value, the second digital value, and an offset code. The offset code has a value that increases a difference between the first oscillation frequency and the second oscillation frequency.

20 Claims, 14 Drawing Sheets

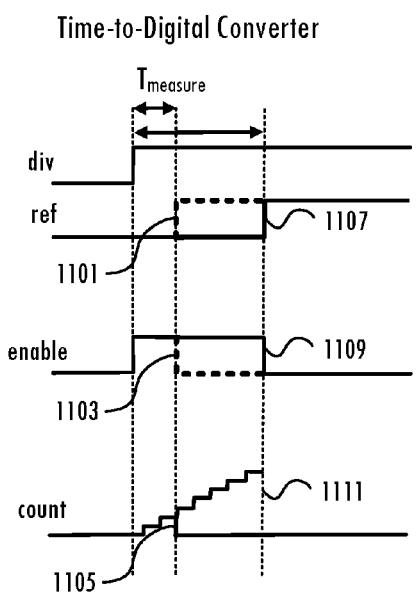
FIG. 13
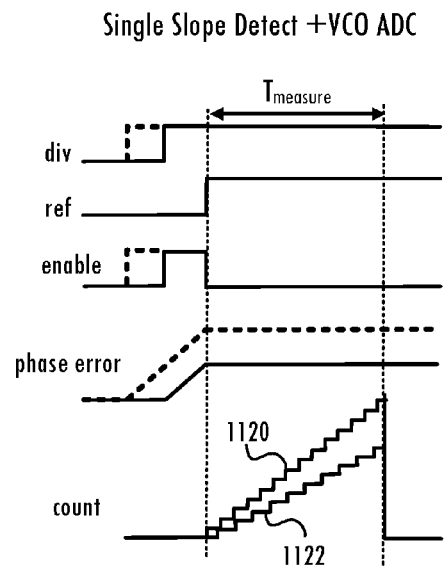
FIG. 14
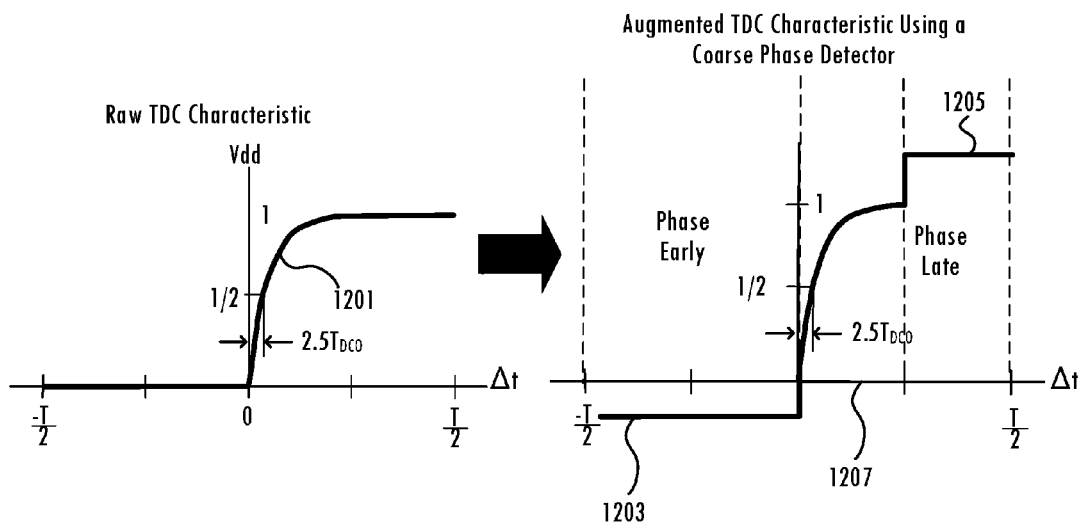
FIG. 15A  FIG. 15B

DIFFERENTIAL VOLTAGE-CONTROLLED OSCILLATOR ANALOG-TO-DIGITAL CONVERTER USING INPUT-REFERRED OFFSET

BACKGROUND

Field of the Invention

This invention relates to phase-locked loops (PLLs) and more particularly to use of a voltage controlled oscillator in a time to digital converter.

Description of the Related Art

FIG. 1 illustrates a prior art analog fractional-N PLL where the VCOCLK 101 is a non-integer multiple of the reference clock (REFCLK) 103. The fractional-N divider 107 supplies a feedback signal (DIVOUT) 108 to a phase and frequency detector (PFD) and charge pump 110 that determines the time difference between edges of the REFCLK signal 103 and the feedback signal 108 and supplies a phase error signal based on the time difference to the loop filter 119. The divide value 105, which is supplied to the fractional-N divider 107, is modulated in time to achieve an average divide value corresponding to the desired divide value 109 supplied to the delta sigma (Δ-Σ) modulator logic 111. The delta sigma modulator logic 111 supplies a digital error signal 115 based on the difference between the divide value 105 supplied to the fractional-N divider and the desired divide value 109. The illustrated prior art PLL includes a digital-to-analog converter (DAC) 117 having a current-based output to convert the digital error signal 115 to a current that is added to the charge pump output signal and supplied to the loop filter 119 to reduce quantization noise.

While FIG. 1 shows an analog PLL, digitally controlled oscillators have become common in PLLs. There is a need to achieve high resolution conversion of the phase error between the feedback clock and the reference clock to a digital value. Accordingly, improvements in generating a digital representation of the phase error are desirable.

SUMMARY OF EMBODIMENTS OF THE INVENTION

In at least one embodiment of the invention, a feedback loop includes an oscillator-based analog-to-digital converter configured to convert an analog signal to a first digital value and a second digital value. The oscillator-based analog-to-digital converter includes a first oscillator having a first oscillation frequency configured to generate a first digital value based on a first signal component of the analog signal. The oscillator-based analog-to-digital converter includes a second oscillator having a second oscillation frequency configured to generate a second digital value based on a second signal component of the analog signal. The first and second signal components are complementary signal components. The feedback loop includes a combiner configured to generate a digital value based on the first digital value, the second digital value, and an offset code. The offset code has a value that increases a difference between the first oscillation frequency and the second oscillation frequency. The feedback loop may be a phase-locked loop, the analog signal may be a phase error signal, the digital value may correspond to the phase error signal, and the first and second oscillators may be voltage-controlled oscillators. The combiner may include a first summing node configured to combine the first digital value and the second digital value to generate a single-ended digital value. The combiner may include a second summing node configured to combine the single-ended value and the offset code to generate the digital value.

In at least one embodiment of the invention, a method of operating a feedback loop includes generating a first digital value and a second digital value using an oscillator-based analog-to-digital converter. The method includes generating a digital signal based on the first digital value, the second digital value, and an offset code. The offset code has a value that increases a frequency difference between a first frequency of oscillation of a first oscillator of the oscillator-based analog-to-digital converter and a second frequency of oscillation of a second oscillator of the oscillator-based analog-to-digital converter. The method may include generating an output phase difference signal based on an input clock signal and a feedback clock signal. The method may include converting the output phase difference signal to an analog signal having a first signal component corresponding to a positive representation of output phase difference signal and a second signal component corresponding to a negative representation of output phase difference signal. The method may include generating a first oscillating signal having the first frequency of oscillation using the first signal component. The method may include generating a second oscillating signal having the second frequency of oscillation using the second signal component.

In at least one embodiment of the invention, a method of operating a phase-locked loop includes converting, using a first charge pump, a phase error corresponding to a time difference between a reference signal and a feedback signal of the phase-locked loop to a first voltage signal corresponding to a positive representation of the phase error. The method includes converting, using a second charge pump, the phase error to a second voltage signal corresponding to a negative representation of the phase error. The method includes supplying the first voltage signal to tune a first ring oscillator to thereby control a first oscillation frequency of the first ring oscillator and supplying the second voltage signal to tune a second ring oscillator to thereby control a second oscillation frequency of the second ring oscillator. The method includes generating a digital value corresponding to the phase error based on a first digital code indicative of the first oscillation frequency, a second digital code indicative of the second oscillation frequency, and an offset value having a value that increases a difference between the first oscillation frequency and the second oscillation frequency. The offset code may introduce a first voltage offset to the first voltage signal and may introduce a second voltage offset to the second voltage signal. The offset code may correspond to a level at least half of an input range of an oscillator-based analog-to-digital converter including the first ring oscillator and the second ring oscillator.

BRIEF DESCRIPTION OF THE DRAWINGS

The present invention may be better understood, and its numerous objects, features, and advantages made apparent to those skilled in the art by referencing the accompanying drawings.

FIG. 13 illustrates the resolution of classical TDC, which is set by an inverter delay.

FIG. 14 illustrates the higher resolution (as compared to the classical TDC) of an embodiment of the TDC described herein in which higher gain in the TVC allows reduction of the impact of the ADC resolution.

FIG. 15A illustrates a raw TDC characteristic assuming a resistor based charge pump in the case where the midpoint charge value occurs when charge(t) has a time span of 2.5 VCO cycles.

FIG. 15B illustrates augmented TDC characteristic in which the usable range of the raw TDC characteristic is extended with the use of a coarse phase detector which adjusts the phase error characteristic to be monotonically increasing across the range of −T/2 to T/2, where T is the reference period.

The use of the same reference symbols in different drawings indicates similar or identical items.

DETAILED DESCRIPTION

Several techniques are described that address wideband PLL phase noise performance. One technique utilizes a capacitor DAC rather than current DAC to achieve $\Delta\Sigma$ quantization noise cancellation. A second technique combines a Time-to-Voltage Converter (TVC) and Voltage-Controlled Oscillator (VCO) based Analog-to-Digital Converter (ADC) to achieve a high performance TDC. Use of a resistor based charge pump in the TVC achieves low flicker noise and avoids current bias circuits, but nonlinearity occurs in the TDC characteristic, which can cause noise folding of the $\Delta\Sigma$ quantization noise. As such, a third technique implements a nonlinear approach to $\Delta\Sigma$ quantization noise cancellation which utilizes the capacitor DAC as well as post ADC (i.e., post TDC) cancellation.

Figure 1:
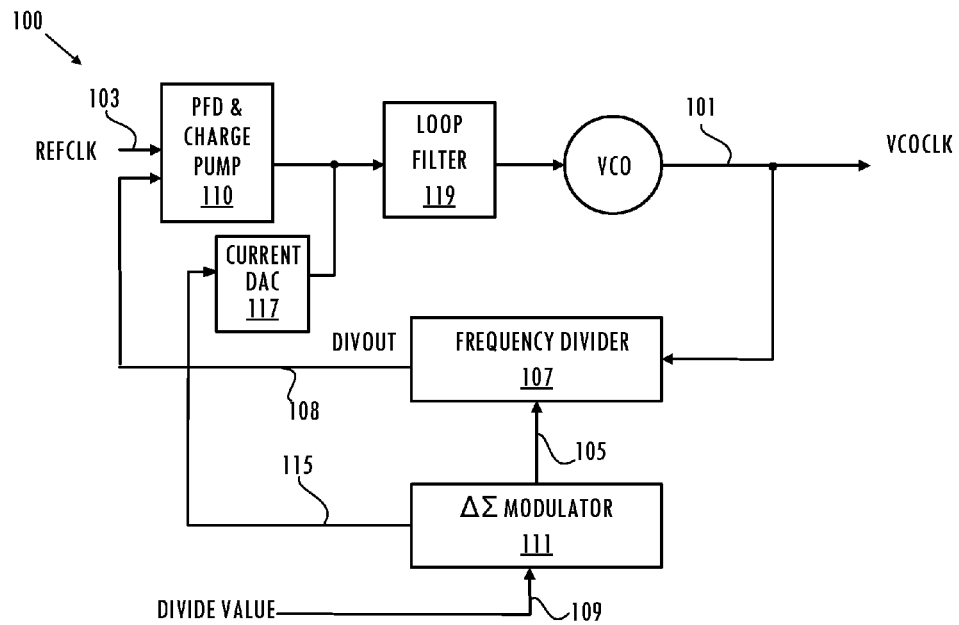
FIG. 1 illustrates a block diagram of a prior art quantization noise cancelling fractional-N PLL using a current DAC with a traditional phase frequency detector (PFD) and charge pump.
Figure 2:
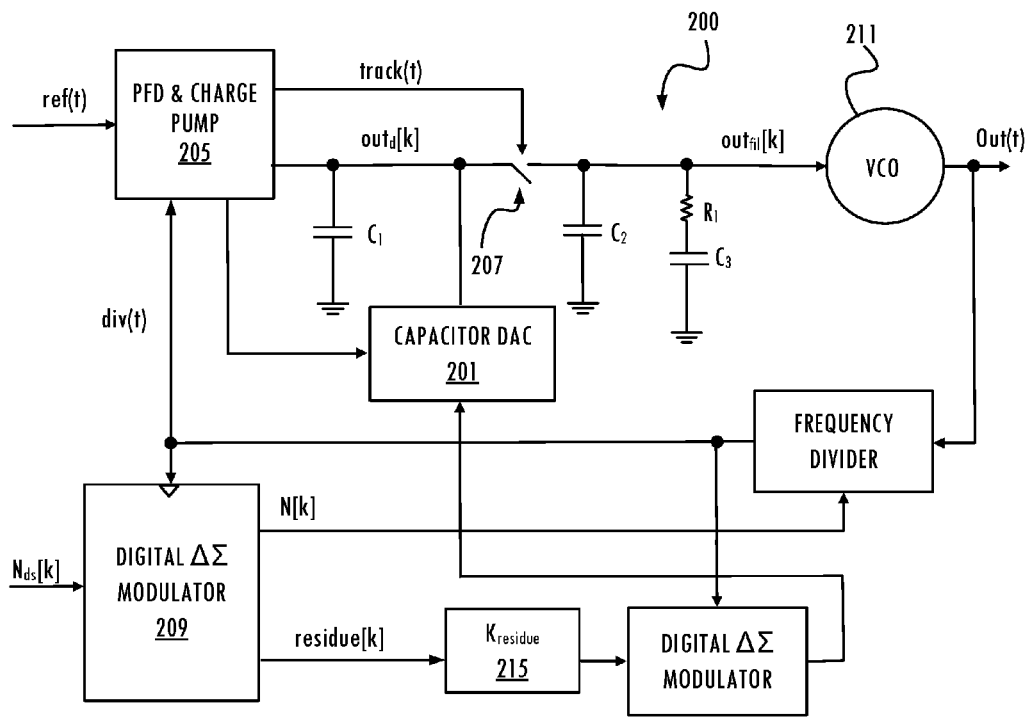
FIG. 2 illustrates a block diagram of a quantization noise cancelling analog fractional-N PLL utilizing a capacitor DAC for cancellation.

Referring to FIG. 2, rather than using a current DAC as shown in FIG. 1, the PLL 200 uses a capacitor DAC 201 for an analog PLL implementation. The advantages of a capacitor DAC over a current DAC are that it achieves better matching of its elements within a given integrated circuit (IC) area, it requires no static power consumption (i.e., only dynamic power consumption when the capacitors are switched from supply to ground or vice versa), it adds no noise beyond the voltage regulator and switches that provide the voltage reference for the capacitor array elements (i.e., kT/C noise), and it can operate at low supply voltages. In the PLL 200, the phase and frequency detector (PFD) and charge pump 205 supplies a signal corresponding to a time difference between the reference signal ref(t) and the feedback signal div(t) that charges capacitor $C_1$ while the signal track(t) keeps switch 207 open. Note that given a fixed reference frequency, the phase error is simply a scale factor of the time difference between the reference signal ref(t) and the feedback signal div(t). The capacitor DAC converts the digital error signal associated with the delta sigma modulator 209 to a voltage that is combined with the voltage on $C_1$. When track(t) closes switch 207, the combined voltage is supplied to control the VCO 211. As with the current DAC approach, proper setting of the gain of the capacitor DAC is required as represented by the digital scale factor 215 ($K_{residue}$) in FIG. 2. While the value of $K_{residue}$ may be determined using adaptive tuning methods, implementing such tuning methods within an analog PLL typically requires high analog complexity, which can be undesirable for mass production devices since it increases design time and introduces risk to the PLL performance being met across temperature and process variations.

Figure 3:
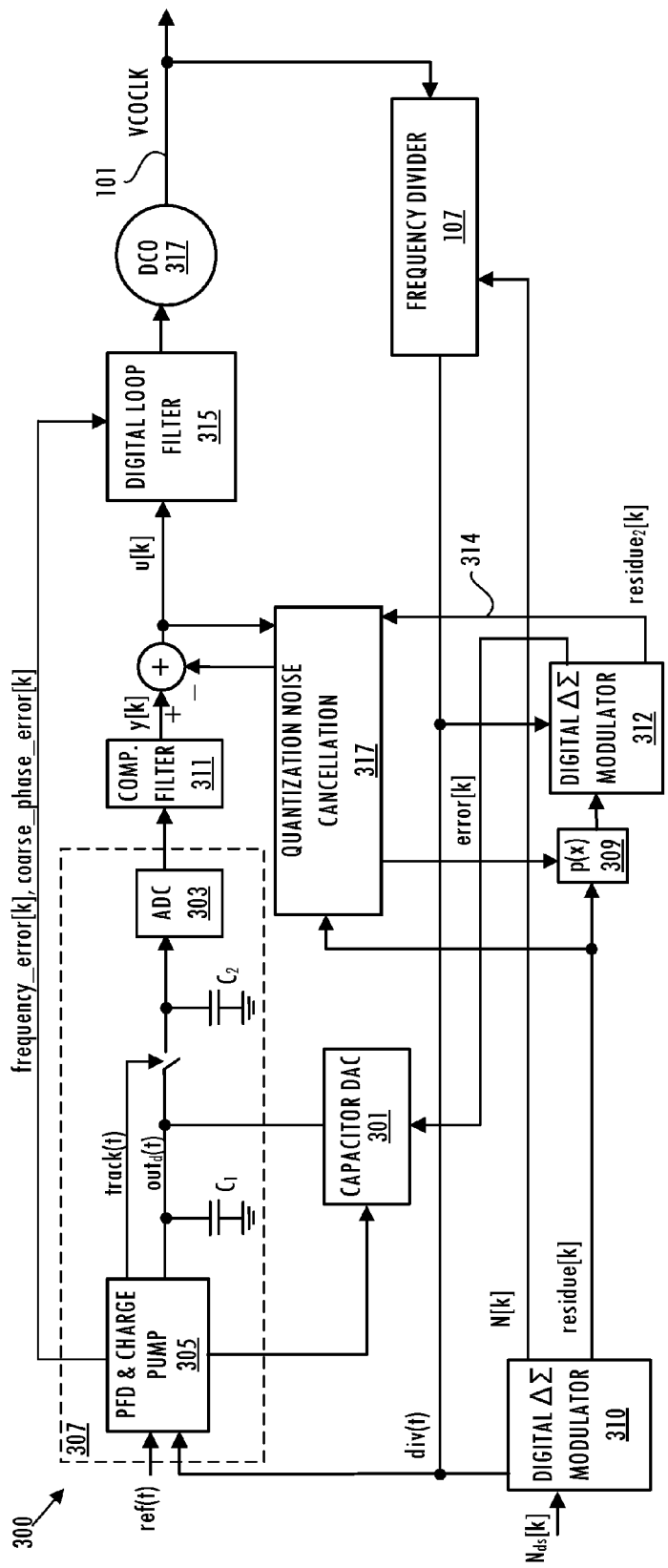
FIG. 3 illustrates a block diagram of an embodiment of a quantization noise cancelling digital fractional-N digital PLL utilizing a capacitor DAC, digital nonlinear quantization noise cancellation, and spur cancellation.

Referring to FIG. 3, instead of using an analog PLL implementation 200, another embodiment utilizes a more digital implementation for PLL 300 when using the capacitor DAC 301. In this case, a high resolution Analog-to-Digital Converter (ADC) 303 digitizes the phase (or time) error signal produced by the PFD/Charge Pump circuits 305. Here the PFD/Charge Pump 305 can be considered as a Time-to-Voltage Converter (TVC) and the combined TVC and ADC 303 can be considered as a Time-to-Digital Converter (TDC) 307. The noise cancellation estimator (Digital ΔΣ Modulator) 310 is implemented in a digital manner. Rather than constraining the cancellation to a linear approach, the digital estimator calculates the coefficients of a polynomial p(x) 309 that allows cancellation of the impact of nonlinearity in the TDC circuit 307. A digital compensation filter (Comp. Filter) 311 helps undo the effects of the filtering operation created by switching capacitor $C_1$ onto capacitor $C_2$. The use of the capacitor DAC 301 lowers the steady-state range required of the ADC 303 since the variation due to quantization noise is reduced, which also reduces the impact of nonlinearity in the ADC 303. In addition to the analog cancellation offered by the capacitor DAC 301, digital cancellation may also be utilized after the ADC to further reduce noise. In particular, the residual error of the capacitor DAC cancellation is computed as $residue_2[k]$ 314, scaled appropriately, and then subtracted from the phase error signal before it is input to the digital PLL loop filter 315. The use of post ADC cancellation may allow the capacitor DAC 301 to have lower resolution. In fact, the ideal capacitor DAC resolution should be high enough to ensure that its residual error is small enough to reduce or eliminate the impact of nonlinearity in the ADC, but low enough such that the residual error can act as a dithering signal for the ADC to better scramble the impact of its quantization noise. Note that Dynamic Element Matching (DEM) techniques can be applied to the capacitor DAC elements in order to reduce or minimize the influence of capacitor mismatch on the DAC cancellation operation. Finally, the availability of the phase (or time) error signal in the digital domain can be leveraged to achieve fractional and non-fractional spur cancellation as explained further herein.

Capacitor DAC

Figure 4A:
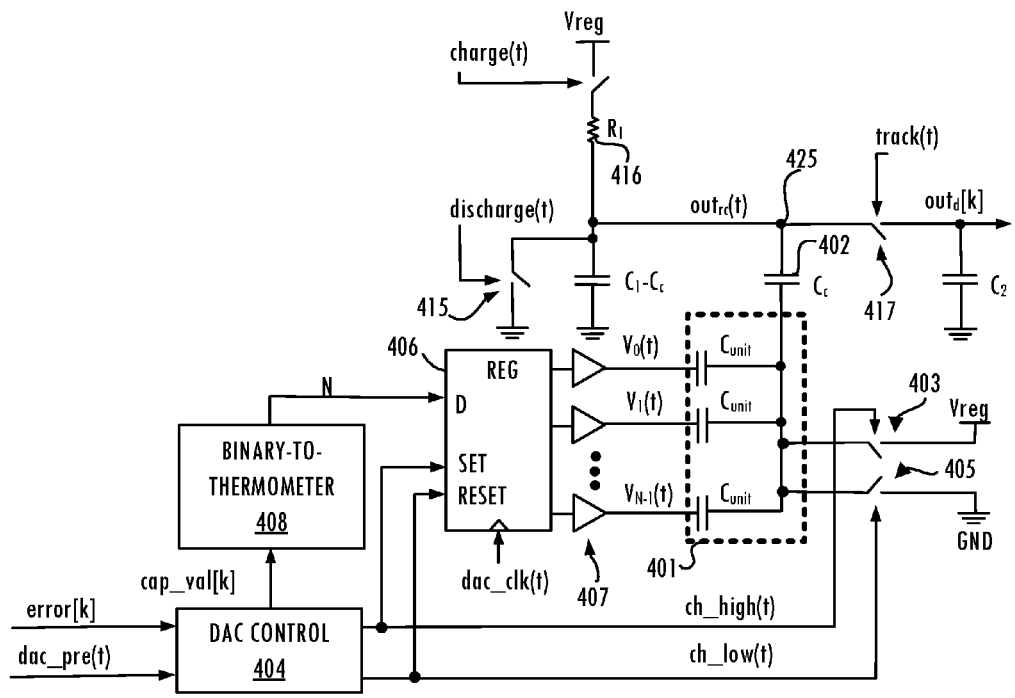
FIG. 4A illustrates an embodiment of a capacitor DAC having N unit capacitors, along with a coupling capacitor, and selective precharging capability to a reference voltage or ground, for a resistor based charge pump.
Figure 4B:
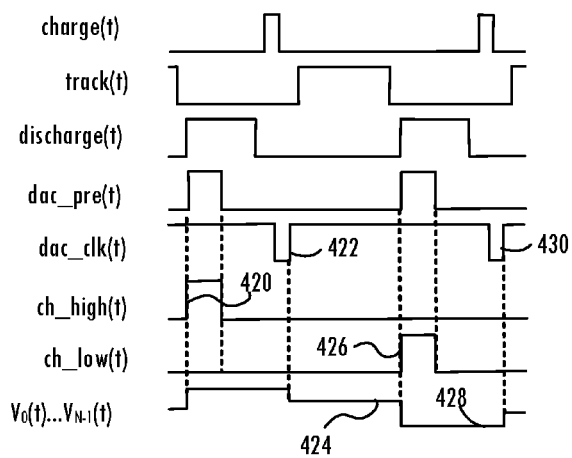
FIG. 4B illustrates a timing diagram associated with the embodiment of FIG. 4A.

FIG. 4A illustrates additional details of an embodiment of a capacitor DAC to achieve quantization noise cancellation for a fractional-N PLL and FIG. 4B illustrates timing of control signals associated with the embodiment of FIG. 4A. An array 401 of equal valued unit capacitors, $C_{unit}$, are combined with a coupling cap, $C_c$ 402 to adjust the voltage of signal $out_{rc}(t)$. The inclusion of $C_c$ 402 allows the $C_{unit}$ capacitors to have large enough size such that desired matching requirements are achieved. Assuming that the sum of the unit capacitors is much greater than $C_c$, the value of $C_1$ is reduced according to $C_c$ as indicated in FIG. 4A ($C_1$–$C_c$) so the capacitance value seen on node 425 is $C_1$ during charging. The value of $C_c$ is chosen large enough to provide the capacitor DAC with adequate range to fully cancel quantization noise caused by dithering of the divider within the fractional-N PLL. The capacitor array is controlled by DAC control logic 404 that receives the signal error[k] corresponding to the quantization noise residue[k] associated with the delta sigma modulator 310 (FIG. 3) that is additionally processed as described further herein to generate error[k]. The DAC control logic 404 converts the error[k] to a value cap_val[k] corresponding to the capacitor control value that corresponds to the error[k] and supplies that control value to the binary-to-thermometer encoder 408. Note that the DAC control logic 404 may also include logic for Dynamic Element Matching in order to noise shape the quantization noise due to mismatch of the DAC capacitor elements. The binary-to-thermometer encoder 408 converts the cap_val[k] value to a thermometer code that supplies a bit for each of the unit capacitors in the array to register 406, which in turn supplies the bits to control charging of the unit capacitors through voltage buffers 407.

The embodiment shown in FIG. 4A provides the ability to precharge the unit capacitors. Note that including the coupling capacitor also allows precharging. The ability to precharge the unit capacitors to either $V_{dd}$ or ground on each of their terminals allows 2N+1 DAC levels to be achieved with only N unit capacitors. The DAC control logic 404 receives the dac_pre(t) timing signal that controls when the precharging takes place. As shown in the timing diagram of FIG. 4B, when ch_high(t) is asserted at 420 in synchronism with the dac_pre(t) signal, register 406 is set causing $V_0(t) \ldots V_{N-1}(t)$ to precharge to their maximum value while the other side of each unit capacitor is coupled to a regulated supply voltage $V_{reg}$ through switch 403. When the dac_clk(t) signal at 422 clocks in thermometer coded values for the DAC into register 406, $V_0(t) \ldots V_{N-1}(t)$ take the value shown at 424, which corresponds to the quantization noise correction voltage that is to be combined with the phase or timing error voltage. Alternatively, the capacitor unit array 401 can be precharged to ground when ch_low(t) is asserted at 426. That causes $V_0(t) \ldots V_{N-1}(t)$ to be reset as shown at 428 and the other side of each unit capacitor to be coupled to ground through switch 405. When the dac_clk(t) clocks at 430, $V_0(t) \ldots V_{N-1}(t)$ take on the thermometer encoded values clocked into register 406, which corresponds to the quantization noise correction voltage that is to be combined with the phase or timing error voltage.

The capacitor DAC can subtract voltage from the phase error or add voltage to the phase error to correct for the quantization error. When the quantization error is positive and the capacitor DAC needs to subtract voltage from phase error voltage on node 425 to cancel the quantization error, the unit capacitors are precharged to the reference voltage on both terminals before thermometer code in register 406 is updated to determine the quantization error correction. When the quantization error is negative and the capacitor DAC needs to add voltage to $out_{rc}(t)$ (node 425), the unit capacitors are precharged to ground before the thermometer code in register 406 is updated to determine the quantization error correction. The DAC control logic determines whether to precharge to ground or the reference voltage based on the value of the error[k] signal received.

The timing diagram FIG. 4B illustrates the order of switching events for the illustrated embodiment. Discharge (t) signal causes $out_{rc}(t)$ (node 425) to be discharged through switch 415 at the start of the cycle. At the same time, the precharge signal dac_pre(t) is asserted to precharge the capacitor DAC to the reference voltage Vdd or ground before the charge pulse charge(t). The charge pulse, charge (t), then charges $out_{rc}(t)$ according to the phase (or time) error in the PLL. After charging node 425, the capacitor DAC value is updated after the charge pulse is completed by clocking in the thermometer code into register 406, and then the track(t) switch is closed. This timing approach reduces or eliminate having the DAC transient influence the charging characteristic of $out_{rc}(t)$ while the charge(t) switch is closed, and also avoids undesired transient behavior, such as ramping of the $out_{rc}(t)$ node, from being seen by the ADC, since the track(t) switch is only closed after $out_{rc}(t)$ is charged based on the phase error and then altered by the capacitor DAC. High gain is achieved when the ratio of charging current to capacitance is relatively high so that a small change in phase difference causes a relatively large change in $out_{rc}(t)$. The larger the gain, the more noise is suppressed in nodes that follow the $out_{rc}(t)$ node. Having a high gain for phase error relaxes the requirements on the ADC that follows. When the track(t) signal is asserted, switch 417 closes, causing the corrected phase error to be transferred to $out_d[k]$. Then the track(t) signal is de-asserted followed by the discharge(t) signal becoming asserted to start the cycle over again. Overall, the transfer of charge to $out_d[k]$ results in the $out_d[k]$ voltage being the corrected phase error voltage.

Figure 4C:
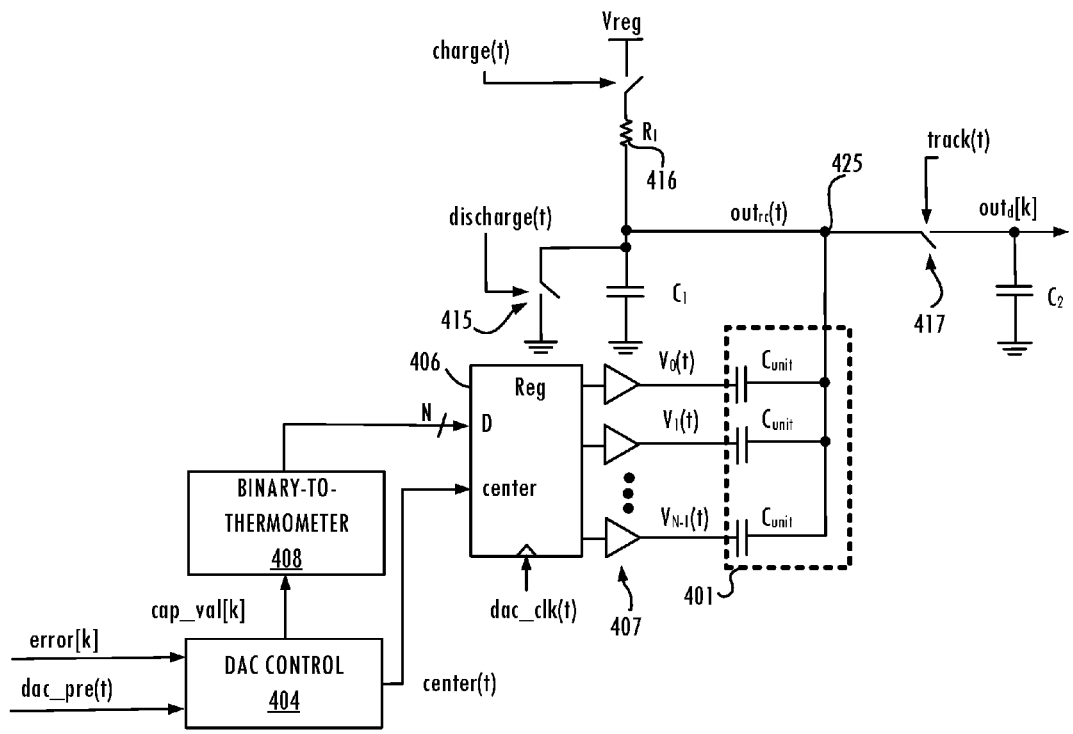
FIG. 4C illustrates an embodiment of a capacitor DAC showing a simplified capacitor DAC structure.
Figure 4D:
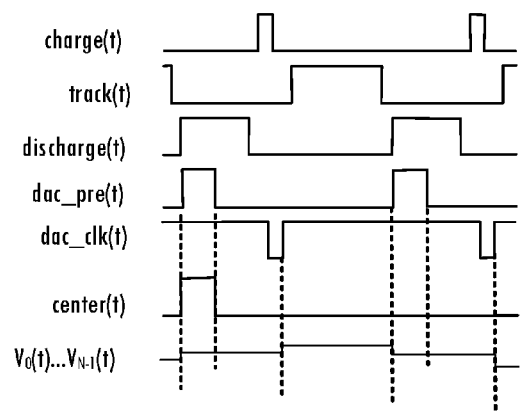
FIG. 4D illustrates a timing diagram associated with the embodiment of FIG. 4C.

In the embodiment of FIG. 4A the capacitor that is charged by the charge pump may be relatively small. In such case, as described earlier, it is beneficial to use the coupling capacitor 402 between that capacitor and the capacitor DAC in order to allow larger sizes for the capacitor DAC elements (to more easily achieve the desired level of matching of the DAC elements). Also, the coupling capacitor allows precharge/charge operations that double the usable range of the capacitor DAC in terms of the number of levels. However, other embodiments may be able to utilize a simplified capacitor DAC structure. FIG. 4C illustrates an embodiment having a simplified capacitor DAC structure. The embodiment may be suitable for applications in which the capacitor charged by the charge pump is sufficiently large so that the capacitor DAC elements are directly coupled to that capacitor (i.e., no coupling capacitor is required). The simplified capacitor DAC structure of FIG. 4C loses the ability to precharge/charge resulting in N+1 rather than 2N+1 levels being available for cancellation. However, for some applications there may be an advantage in having the simpler capacitor DAC structure. The timing diagram in FIG. 4D illustrates the order of switching events for the illustrated embodiment. Comparison of FIG. 4D to FIG. 4B reveals that the capacitor DAC is centered rather than precharged to a high or low value upon the assertion of the dac_pre(t) signal, but many of the other timing aspects are similar to those discussed with reference to FIG. 4B.

Figure 5:
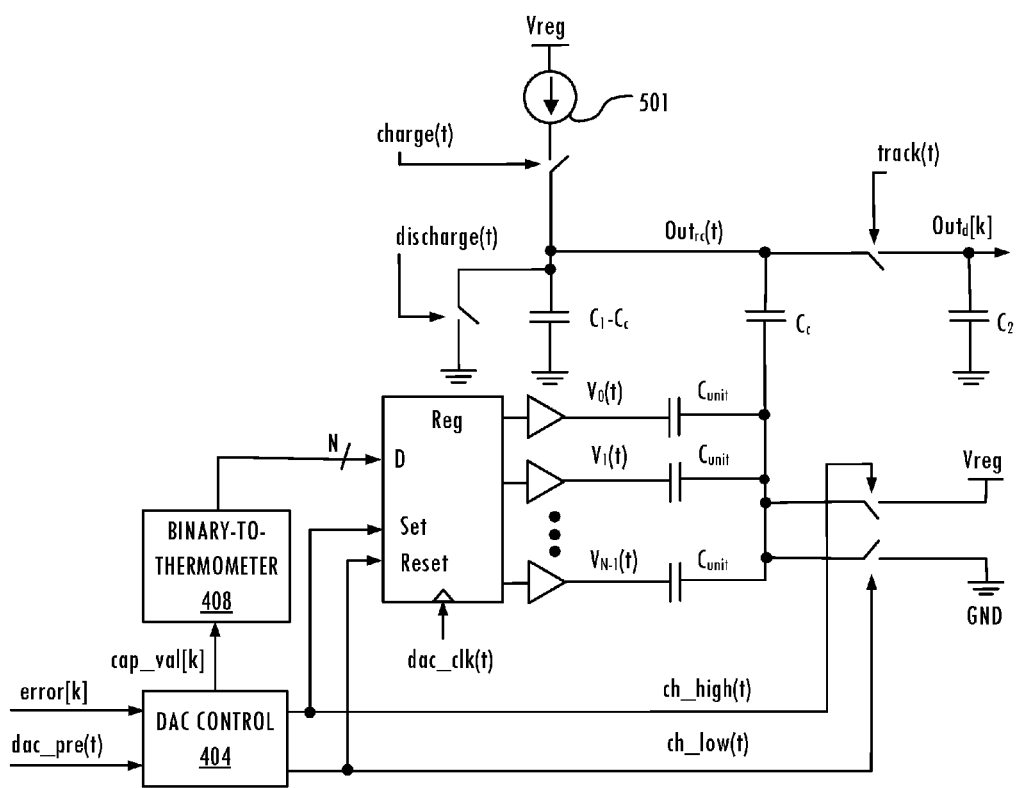
FIG. 5 illustrates an embodiment of a capacitor DAC using N unit capacitors, along with a coupling capacitor, and selective precharging capability to a reference voltage or ground, for a current source based charge pump.

FIG. 5 shows an embodiment in which the capacitor DAC structure is applied when the charge pump is implemented with a current source 501 rather than a resistor 416 as shown in FIG. 4A. FIG. 5 utilizes the same timing shown in FIG. 4B. The advantages of using the resistor based charge pump rather than a current source based charge pump are a lower flicker noise corner and the avoidance of a bias current network to set the charge pump current. The disadvantages of using the resistor based charge pump are a significantly nonlinear charging characteristic when closing the charge(t) switch and the requirement of a low noise voltage regulator to attenuate the impact of supply noise. The nonlinear charging characteristic can be addressed by performing nonlinear quantization noise cancellation. The requirement of a low noise voltage regulator is also shared by the capacitor DAC, and has become common practice for many modern mixed signal designs.

Figure 6A:
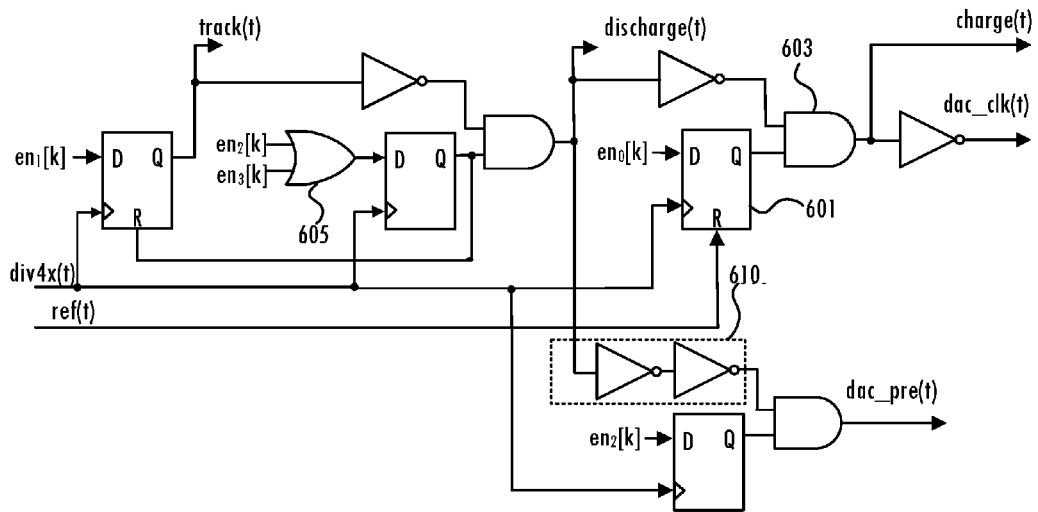
FIG. 6A illustrates a high level diagram of phase detector logic including generation of timing control signals for the capacitor DAC.
Figure 6B:
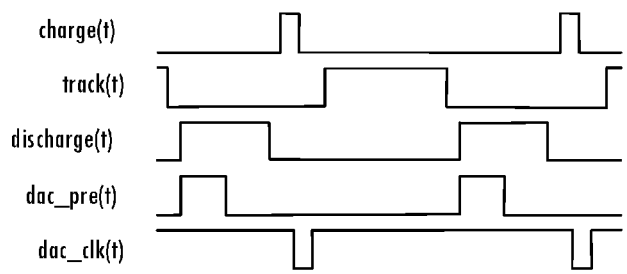
FIG. 6B illustrates a timing diagram associated with the embodiment of FIG. 6A.

FIGS. 6A, 6B, 7A, and 7B illustrate various aspects of embodiments to realize the various timing signals utilized for phase (or time error) detection and capacitor DAC control. The phase detector and DAC control circuit, shown in FIG. 6A, utilizes enable signals that are generated from the frequency divider output shown in FIG. 7A. In the illustrated embodiment, the frequency divider 701 receives the digitally controlled oscillator (DCO) clock 703 and outputs a signal (div4x(t)) having a frequency that is four times that of the reference clock ref(t) when the PLL is in lock, which simplifies the creation of multiphase enable signals as shown in FIGS. 6A and 6B. By leveraging these enable signals in conjunction with the higher divider frequency, the phase detector logic shown in FIG. 6A is able to achieve the various timing control signals with a relatively simple implementation. Those control signals are utilized, e.g., in the embodiment illustrated in FIG. 4A.

Referring to FIGS. 6A, 6B, 7A, and 7B, when $en_0[k]$ goes high, the phase detector compares the next rising edge of div4x(t) to the reference clock ref(t) rising edge. As shown in FIG. 6A flip-flop 601 receives signal $en_0[k]$. When $en_0[k]$ goes high, the flip-flop output goes high on the next rising edge of div4x(t). Assuming discharge(t) is 0, causing the other input to AND gate 603 to be high, when the output of flip-flop 601 goes high the output of AND gate 603 goes high causing the charge signal to be asserted. The rising edge of ref(t) causes the charge signal to be deasserted. The logic shown in FIG. 6A is an embodiment to generate the timing signals shown in FIGS. 4B and 6B. The track(t), discharge (t), and dac_pre(t) signals can all be generated using the reference and feedback clocks and the four enable signals. The enable signals $en_2[k]$ and $en_3[k]$ supplied to OR gate 605 ensure that discharge(t) lasts for approximately two div4x(t) cycles. Inverters shown in FIG. 6A, such as inverters 610, are relied upon to create delay in order to achieve nonoverlapping regions between the control signals. For example, the precharge signal dac_pre(t) asserts after delay from two inverters and an AND gate after discharge(t) has become asserted. Note that longer inverter chains may be required in practice to achieve sufficiently wide, non-overlap regions that are robust in the face of temperature and process variations.

Figure 7A:
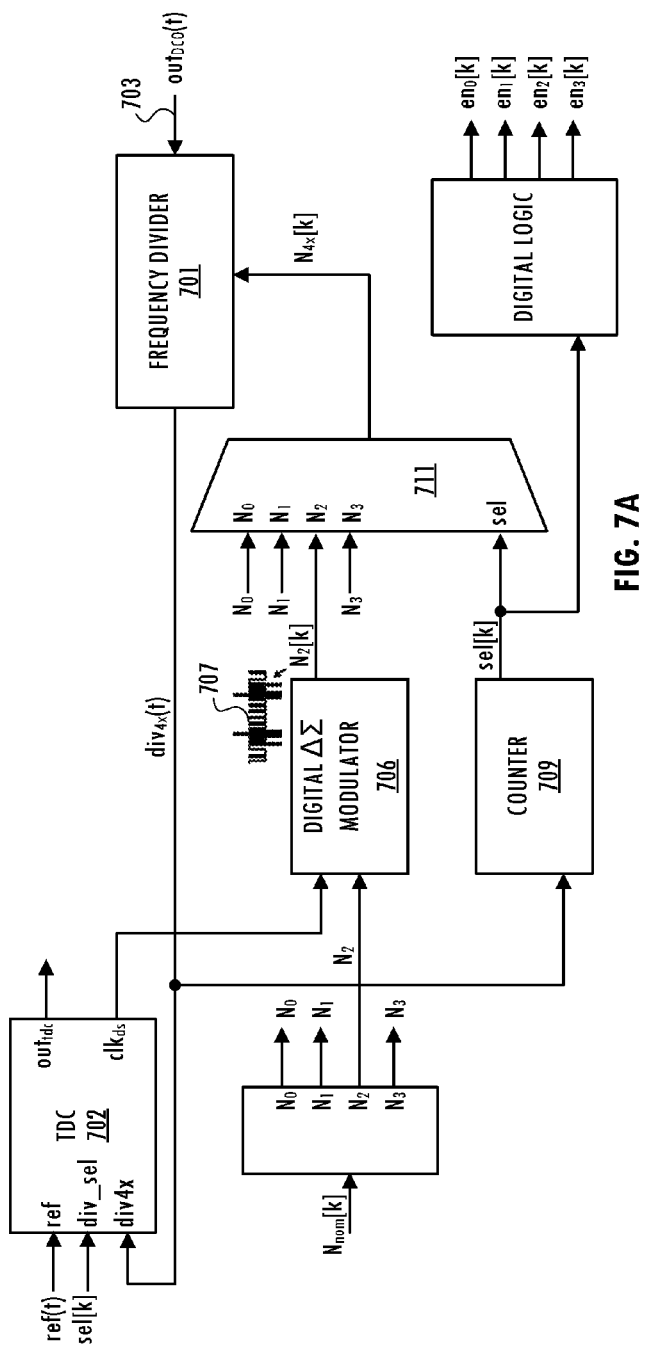
FIG. 7A illustrates an embodiment utilizing a frequency divider whose output frequency is four times that of the reference frequency when the PLL is in lock in order to generate enable signals used by the phase detector and capacitor DAC.
Figure 7B:
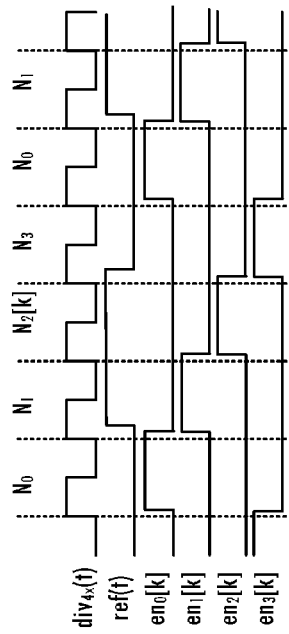
FIG. 7B illustrates a timing diagram associated with the embodiment of FIG. 7A.

FIGS. 7A and 7B illustrate an embodiment showing how the frequency divider 701 that supplies div4x(t) may be controlled. As discussed above, the output signal div4x(t) is four times the frequency of the reference clock when the PLL is in lock. The nominal divider value $N_{nom}[k]$ may be, e.g., 60.53, leading to $N_0$, $N_1$, $N_2$, and $N_3$ nominally having a value of 15. $N_{nom}[k]$ is the sum of $N_0$-$N_3$. Note that $N_2$ is the only value dithered by the digital $\Delta$-$\Sigma$ modulator in the illustrated embodiment, as illustrated by the dithering shown at 707. The counter 709 provides the select signal to multiplexer 711 to cycle through the four divide values to select $N_0$-$N_3$, which are provided to the frequency divider 701. The counter value is also used to generate the enable signals as previously discussed.

High Performance Time-to-Digital Converter

Figure 8:
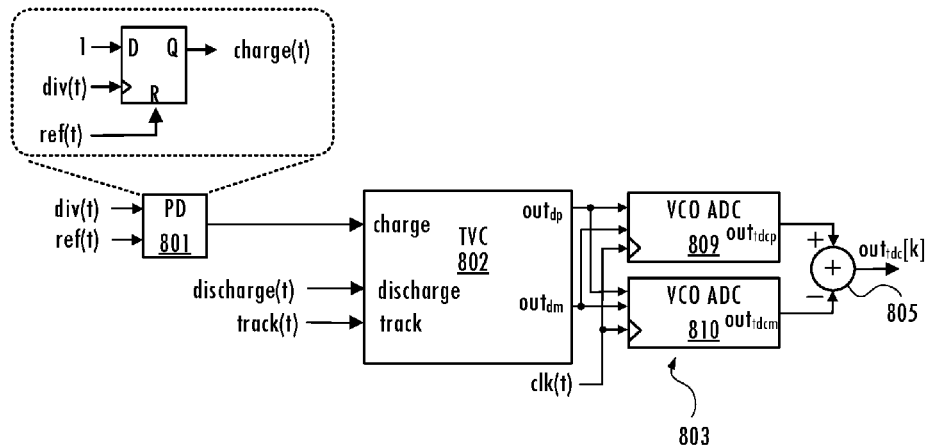
FIG. 8 illustrates a view of PFD/Charge pump as a Time-to-Voltage Converter (TVC), which, when combined with an analog-to-digital converter (ADC), leads to a Time-To-Digital Converter (TDC) structure.

As mentioned earlier, the PD/charge pump circuits can also be viewed as a Time-To-Voltage Converter (TVC) since the time error between the reference clock signal ref(t) and the divider signal div(t) of the PLL is translated to a voltage according to the length of time that the charge(t) switch is closed. Referring to FIG. 8, the illustrated TVC embodiment is a pseudo-differential embodiment that includes a phase detector circuit 801 and a charge pump circuit 802 that provides a positive output ($out_{dp}$) and a negative output ($out_{dm}$). By then using the Analog-to-Digital Converter (ADC) 803, which includes ADC 809 and ADC 810, to convert the voltage to a digital value, a Time-to-Digital Converter (TDC) 800 is achieved. A simple Phase Detector (PD) circuit 801 is shown as an example in FIG. 8 that creates a charge(t) pulse which corresponds to the time error between output phases of the reference clock signal and the feedback signal (div(t)) from the divider. Note that the reference clock signal ref(t) edge is assumed to follow the div(t) edge during steady-state operation for the exemplary phase detector circuit 801. Use of the pseudo-differential architecture allows attenuation of unwanted DC common-mode noise signals.

Figure 9:
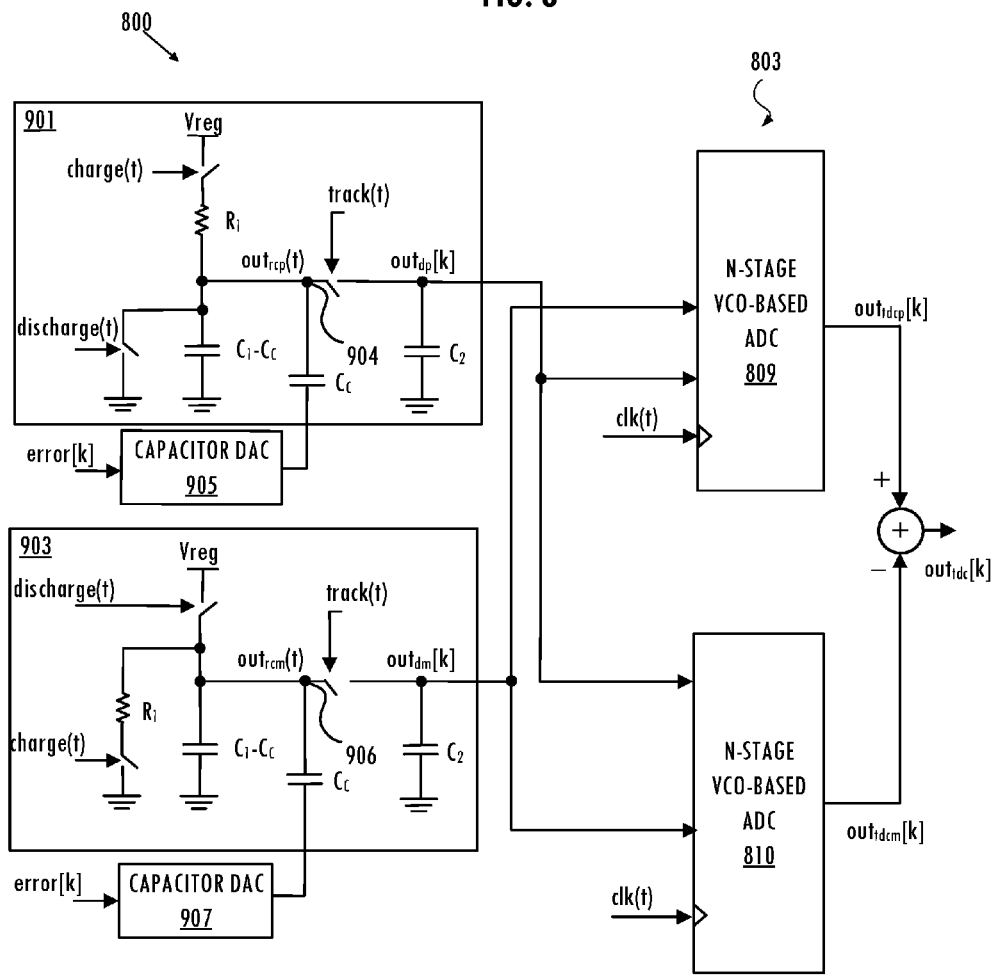
FIG. 9 illustrates an embodiment of a pseudo-differential TDC which includes two resistor based TVCs, two capacitor DACs for quantization noise cancellation, and two VCO-based ADCs.

FIG. 9 shows an embodiment of aspects of the pseudo-differential TDC structure 800. The pseudo-differential TDC structure 800 includes two resistor based charge pumps 901 and 903, two capacitor DACs 905 and 907 for quantization noise cancellation, and an analog to digital converter that includes two N-stage voltage controlled oscillator (VCO)-based ADCs 809 and 810. The use of resistor based charge pumps provides the advantage of low 1/f noise, which is often a significant issue in advanced CMOS designs. The resistor based charge pump has better low frequency phase noise performance but also has a non-linear characteristic such that the amount of current supplied is a function of the voltage difference across $R_1$, which changes in time. Alternatively, current sources could be used in place of the resistor based charge pumps but current sources tend to introduce increased 1/f noise into the system. Once thermal or flicker noise is introduced into the system, it can not be removed. However, the impact of nonlinearities caused by the resistor-based charge pumps can be addressed using signal processing techniques such as nonlinear quantization noise cancellation as previously discussed.

Figure 10:
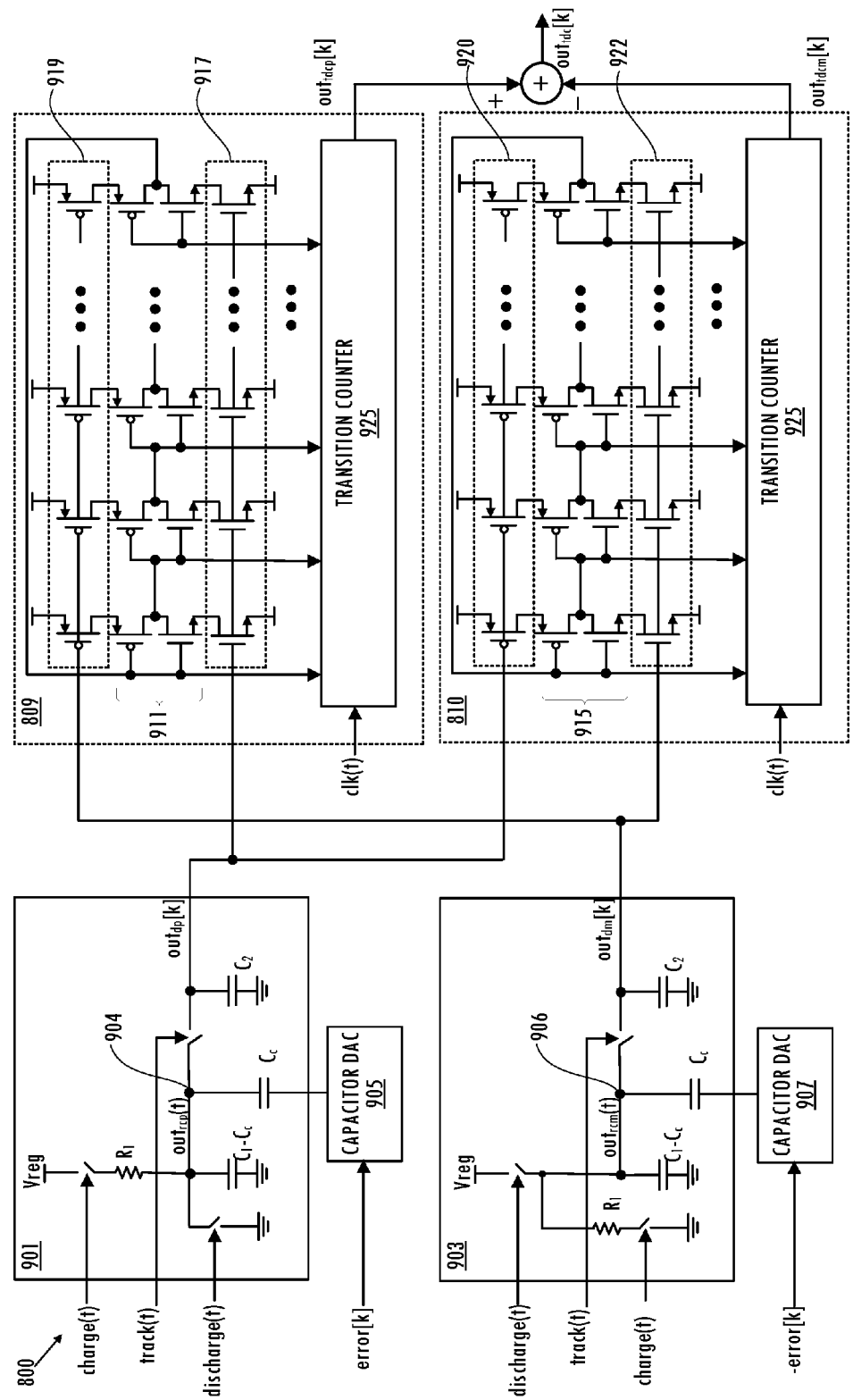
FIG. 10 illustrates additional details of the two VCO-based ADCs of FIG. 9.

Referring to FIG. 10, the VCOs of ADCs 809 and 810 are implemented as ring oscillators using inverter stages 911 and 915. The frequency of the oscillators is determined by tuning transistors 919 and 917 for inverter stages 911 and tuning transistors 920 and 922 for inverter stages 915. The two resistor based charge pump circuits 901 and 903 charge their outputs in opposite directions according to the charge(t) pulse. The discharge(t) pulse causes the node $out_{rcp}$ 904 to be discharged to ground while the node $out_{rcm}$ 906 charges to a regulated supply voltage Vreg. The output of charge pump circuit 901 feeds directly into NMOS tuning transistors 917 and PMOS tuning transistors 920 to tune the frequency of the VCOs. The output of the charge pump circuit 903 feeds directly into NMOS tuning transistors 922 and PMOS tuning transistors 919 to tune the frequency of the VCOs. The inverter chains 911 and 915 disposed between the tuning transistors and the voltages on the gates of the tuning transistors determine the frequency of the ring oscillators. As shown in FIG. 10, the gate signals of the tuning transistors are supplied by the positive phase error $out_{dp}[k]$ and the negative phase error $out_{dm}[k]$. The use of both NMOS and PMOS tuning devices in the VCO-based ADC allows a pseudo-differential topology that achieves high tuning gain for controlling the frequency of the ring oscillator within the VCO-based ADC, which provides advantages in noise performance. By utilizing direct voltage tuning of the VCO-based ADCs rather than an approach involving current mirrors, extra current bias circuits are avoided, which yields better noise performance for a given amount of power dissipation, and low voltage operation is readily achieved.

Note that the connections from TVC to VCO-based ADC tuning devices is symmetric in the sense that $out_{dp}[k]$ and $out_{dm}[k]$ each influence both NMOS and PMOS devices, which improves even order cancellation of nonlinearity in the ADCs and also helps to reduce the impact of gate leakage on these nodes. However, this connection arrangement largely removes information of the common-mode value of $out_{dp}[k]$ and $out_{dm}[k]$ from the ADC outputs. Fortunately, the common-mode value of $out_{dp}[k]$ and $out_{dm}[k]$ is implicitly set by the opposite charging characteristics of the TVC outputs, and the capacitor DAC input values can be set to have opposite sign as shown in FIG. 10. Since this arrangement leads to a common-value of zero from the pseudo-differential capacitor DACs, undesired common-mode variations of $out_{dp}[k]$ and $out_{dm}[k]$ due to mismatch will not be suppressed. Fortunately, the impact of such mismatch-induced common-mode variations are insignificant assuming design practices are employed to ensure matching between the circuit elements of the TDC, and appropriate calibration techniques are employed. As FIGS. 9 and 10 imply, the use of a VCO-based ADC rather than an alternative ADC structure offers a relatively simple implementation of the overall TDC. FIG. 10 also shows transition counter logic 925, which determines the number of edges that occur in the oscillator of the VCO-based ADC within a given measurement interval and thus provides an indication of frequency of the respective oscillator.

As a representative example of operation, note that phase error leading to an increased pulse width for the charge(t) signal will cause node $out_{dp}[k]$ to increase in voltage and the node $out_{dm}[k]$ to decrease in voltage for the circuit shown in FIG. 10. In turn, the higher voltage of node $out_{dp}[k]$ and lower voltage of node $out_{dm}[k]$ will lead to an increase in the frequency of the ring oscillator 911 in ADC 809 and a decrease in the frequency of ring oscillator 915 in ADC block 810. The resulting change in frequency is due to the fact that higher voltage on the gates of the NMOS transistors 917 and lower voltage on the gates of the PMOS transistors 919 leads to increased current availability for inverter stages 911 and therefore a higher frequency of oscillation. Similarly, a lower voltage on the gates of the NMOS transistors 922 and higher voltage on the gates of the PMOS transistors 920 leads to decreased current availability for inverter stages 915 and therefore a lower frequency of oscillation. For the case of phase error leading to a decreased pulse width for the charge(t) signal, node $out_{dp}[k]$ will decrease in voltage and node $out_{dm}[k]$ will increase in voltage leading to a decrease in the frequency of the ring oscillator 911 in ADC 809 and an increase in the frequency of ring oscillator 915 in ADC block 810. Therefore, subtraction of the measured frequency values of VCO-based ADC blocks 809 and 810 leads to an error signal proportional to the phase error. The outputs of transition counters 925 provide an indication of the VCO-based ADC frequency information as digital signals. Therefore, as shown in FIG. 10, the positive $out_{tdcp}[k]$ signal and the negative $out_{tdcm}[k]$ signal are subtracted in summer 805 to generate the $out_{tdc}[k]$ signal that is a digital value that corresponds to the phase error. Note that in FIG. 10, both voltages are used to tune oscillators 911 and 915. In other embodiments, the voltage $out_{dp}[k]$ may be used alone to tune oscillator 911 and $out_{dm}[k]$ may be used alone to tune oscillator 915. Alternatively, tuning transistors 919 and 920 (or 917 and 922) could be omitted entirely. Note that the voltage controlled oscillators used in various embodiments shown, e.g., in FIGS. 9 and 10, may also be implemented by using an intermediate circuit to convert the voltage of the TVC into one or more currents, and then supplying the current(s) to control the frequency of one or more current controlled oscillators.

To obtain the benefits of using a pseudo-differential architecture, ADC 809 and ADC 810 should operate independently, although the VCOs (the ring oscillator 911 and the ring oscillator 915, respectively) of the ADC 809 and the ADC 810 oscillate within the same frequency range. Each of the VCOs draws an oscillation current, $I_{OSC}$, and a current may be injected from one of the VCOs to the other VCO. For small, non-zero, differential inputs, that injection current may cause one of the VCOs to injection lock to the other VCO. That is, one of the VCOs couples to the other VCO and the VCOs oscillate at the same frequency. In general, injection locking and injection pulling are frequency effects that can occur when a harmonic oscillator is disturbed by a second oscillator operating at a nearby frequency. The injection locking range is approximately $$f_L \approx \frac{f_{osc}}{2Q} \times \frac{I_{inj}}{I_{osc}},$$

where $f_{osc}$ is approximately the center frequency of each VCO, Q is the quality factor of the VCO, $I_{inj}$ is the magnitude of the current injected from one VCO to another, and $I_{osc}$ is the current drawn by each VCO. As a result of the injection locking, operation of the VCO-based ADC of pseudo-differential TDC 800 includes a dead band at the VCO-based ADC input, i.e., pseudo-differential TDC 800 cannot distinguish between small inputs and a zero input level, which can be catastrophic in some applications. When the VCO-based ADC has an input-referred offset, the dead band is not centered around the zero input level, but rather, is centered around the input-referred offset level of the VCO-based ADC and pseudo-differential TDC 800 may not be able to distinguish between inputs with a small variation from the input-referred offset level and the input-referred offset level.

A technique for reducing or eliminating effects of a dead band caused by injection locking in a VCO-based ADC includes reducing the injection current by physically separating the layouts of the VCOs (e.g., the ring oscillator 911 and the ring oscillator 915) on an integrated circuit substrate to intentionally separate injection current paths. However, physical separation on an integrated circuit substrate to reduce the injection current may not improve the quality factor of those VCOs since physical separation may increase device mismatch. In addition, the physical separation of the VCOs may increase the area and cost of the integrated circuit. Circuit techniques for reducing or eliminating effects of a dead band caused by injection locking in a VCO-based ADC include utilizing voltage regulator designs that increase power supply rejection to reduce the injection current. Those circuit design techniques may substantially increase area and cost of the integrated circuit. In addition, note that these physical design techniques and circuit design techniques may reduce coupling between the two VCO-based ADCs to mitigate, but not eliminate injection locking.

Figure 11:
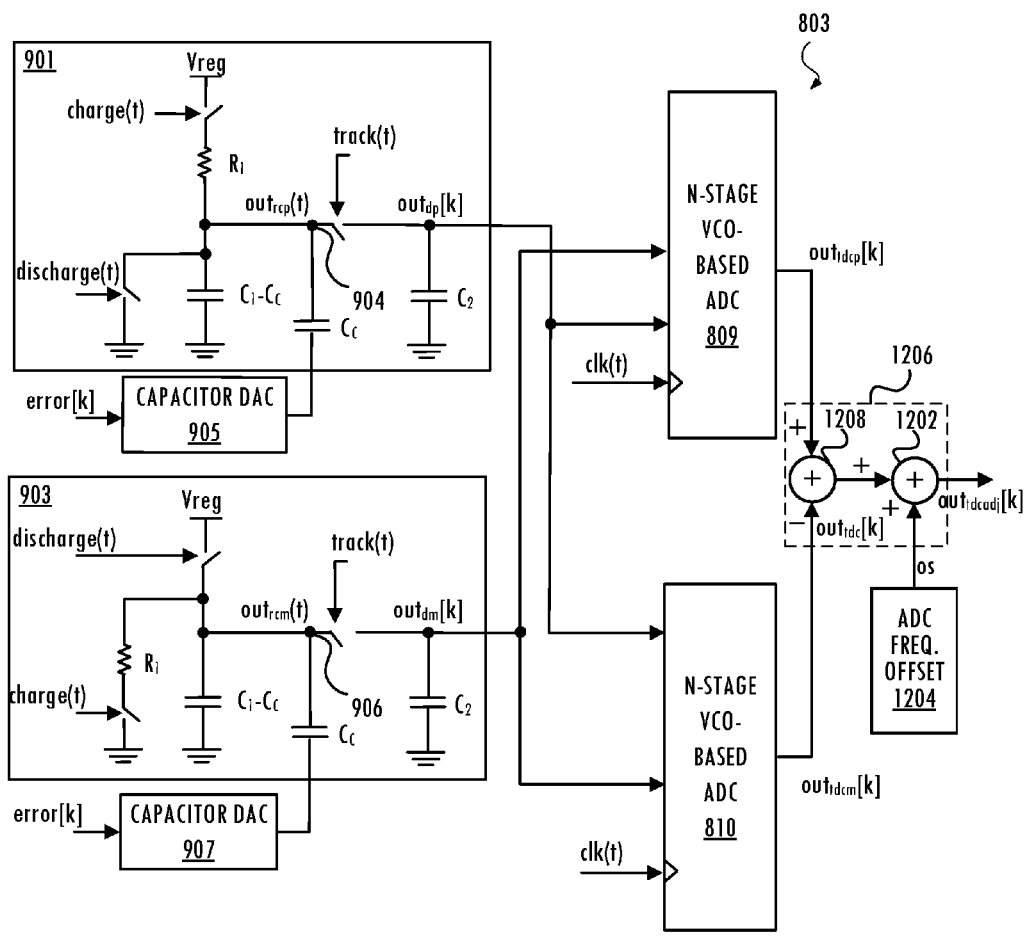
FIG. 11 illustrates an embodiment of a pseudo-differential TDC which includes two resistor based TVCs, two capacitor DACs for quantization noise cancellation, and two VCO-based ADCs using an input-referred offset consistent with at least one embodiment of the invention.

Referring to FIG. 11, a feedback technique that eliminates injection locking in in a VCO-based ADC shifts the frequency ranges of the two VCOs away from each other. Since the VCO-based ADC is configured in a negative feedback loop (e.g., PLL 300 of FIG. 3) including at least one integrator after the VCO-based ADC, the negative feedback loop maintains the output of the VCO-based ADC at zero mean. Accordingly, digital application of a predetermined digital code at the output of the VCO-based ADC causes an offset at the input of the VCO-based ADC that effectively shifts the frequency ranges of the two VCOs away from each other to eliminate injection locking. FIG. 11 illustrates application of a digital offset code os at the output of the VCO-based ADC to induce an input-referred offset that shifts the frequency ranges of the two VCOs away from each other. If the input-referred offset is greater than half the ADC input range, then the frequency ranges of the two VCOs become mutually exclusive, and injection locking is no longer possible. However, that input-referred offset must be tolerated by the other elements of the feedback loop. The input-referred offset technique for eliminating injection locking in a VCO-based ADC may be applied to any system where feedback drives the VCO-based ADC input to zero on average.

In at least one embodiment, the ADC frequency offset 1204 stores one or more digital values that the combiner 1206 combines with the output of the VCO-based ADC. For example, summing node 1202 combines the digital offset code os with a single-ended output signal of the VCO-based ADC 803. However, combiner 1206 may digitally apply the digital offset code to the negative feedback loop using other equivalent combination operations and may be performed using one or more digital offset codes provided by ADC frequency offset 1204 (e.g., combination of the digital offset code os with $out_{tdcp}[k]$ prior to summing node 1208, combination of the digital offset code with $out_{tdcm}[k]$ prior to summing node 1208, or combination of a first digital offset code osp with $out_{tdcp}[k]$ and a second digital offset code osm with $out_{tdcm}[k]$ prior to summing node 1208).

Figure 12:
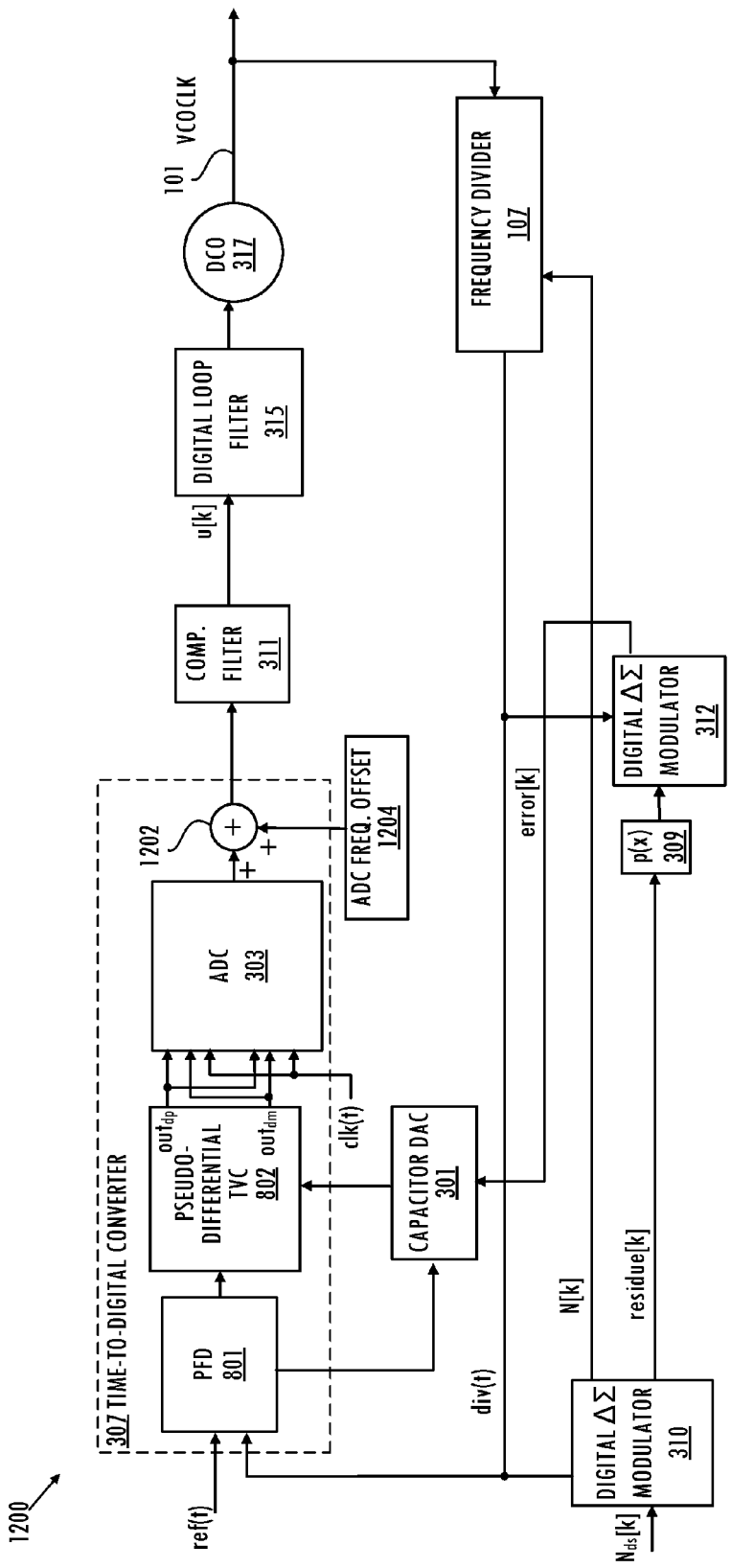
FIG. 12 illustrates a block diagram of an embodiment of a quantization noise cancelling digital fractional-N digital PLL utilizing a pseudo-differential TDC which includes two resistor based TVCs, two capacitor DACs for quantization noise cancellation, and two VCO-based ADCs using an input-referred offset consistent with at least one embodiment of the invention.

Referring to FIG. 12, in at least one embodiment, the PLL 1200, combines a digital offset code with a digital signal based on an output of the ADC 303. That combination may be performed in other locations of the forward path of the PLL 1200. For example, the combiner 1202 may be included in the compensation filter 311, or included before, after, or within the digital loop filter 315 to combine a suitable digital offset code stored in the ADC frequency offset 1204 with other versions of the digital signal in the forward path, prior to the DCO 317. Rather than introducing the digital offset at the output of the VCO-based ADC, as described above, intentionally mismatching the VCO-based ADC circuits by an amount that offsets the VCO frequency ranges, however, such implementation also reduces efficacy of the pseudo-differential design due to the lack of matching between the complementary sides.

The digital offset code has a predetermined value that is sufficient to cause the VCO-based ADC circuits to oscillate with nonoverlapping frequencies ranges. The digital offset code may be determined empirically during production test or during initialization by characterization of an associated integrated circuit and may be stored in non-volatile memory for later use in a target application. The digital offset code may be updated dynamically during operation of the associated integrated circuit, although such updates may not be necessary in some applications.

A particular advantage of the combined TVC and VCO-based ADC structure for realizing a TDC is that the impact of the ADC quantization noise (and ADC thermal and flicker noise) can be reduced by increasing the gain in the TVC. As indicated in FIGS. 13 and 14, the ability to reduce the impact of quantization noise is in contrast to classical TDC designs in which the quantization noise is set by the inverter delay in the CMOS process being used. FIGS. 13 and 14 show a comparison of resolution of the classical TDC (FIG. 13), which is set by an inverter delay, versus the TDC described herein (FIG. 11), in which higher gain in the TVC allows reduction of the impact of the ADC resolution. In FIG. 13 the rising edge of Ref clock determines the falling edge of the Enable signal. When ref clock rises at 1101, the enable signal falls at 1103 and the count stops at 1105. If the ref signal rises later at 1107 because of a larger phase difference the enable signal continues until 1109 and the count continues until 1111. However, the count value in FIG. 13 has a constant slope such that resolution can be increased only by reducing inverter delay in the TDC. In FIG. 14, the enable signal, which corresponds to the charge(t) signal, similarly takes on a pulse width corresponding to the difference in time between the rising edges of the divider output (DIV) and ref clock. However, the count value in FIG. 14 (1120 or 1122) is determined by the pulse width of the enable signal in combination with the gain of the TVC and the delay per stage of the VCO-based ADC. A large gain in the TVC ensures that the count value produced by the ADC over the measurement interval $T_{measure}$, which typically corresponds to the period of the ref clock, will be significantly impacted by the phase error change reflected in the voltage error signal supplied to the ADC. In particular, a large TVC gain will lead to a wider range of frequency variation in the VCO-based ADC for a given range of phase error, and therefore lead to a higher range of count values for that given range in phase error such that each change in count value corresponds to a smaller phase error step size. The different count values for different phase errors are reflected in the count values 1120 and 1122.

Larger gain in the TVC shown in FIG. 10 is achieved by reducing the value of $R_1C_1$ such that nodes $out_{rcp}(t)$ and $out_{rcm}(t)$ have a faster charging characteristic as a function of the charge(t) pulse width. In an exemplary embodiment the resistance $R_1$ is 1 kOhms, the capacitance $C_1$ is approximately 350 fF, the coupling capacitor $C_c$ is approximately ⅓ to ½ of $C_1$ and the unit capacitors (see FIG. 4A) are approximately 50 fF. These particular values are only examples and the capacitor values used in any particular embodiment can change based on the requirements of the particular embodiment and process technology. While a faster charging characteristic can provide increased gain, increased TVC gain leads to a smaller phase error detection range and higher nonlinearity seen by the divider-induced quantization noise. As such, design of the TVC gain value involves a tradeoff between lowering the impact of noise in the VCO-based ADC versus achieving adequate phase detector range to accommodate noise and perturbations in the PLL phase error signal and reasonable levels of nonlinearity to achieve the desired level of performance of the nonlinear quantization noise cancellation.

The PLL generally requires a wider phase detection region to acquire frequency lock than during steady-state operation, which only requires an adequately large phase detection range to accommodate noise and perturbations. Some embodiments may augment the raw TDC characteristic with a coarse phase detector that is only active outside of the steady-state operating range of the phase (or time) error signal. FIG. 15A illustrates the raw TDC characteristic at 1201 assuming the resistor based charge pump in the case where the midpoint charge value occurs when charge(t) has a time span of 2.5 DCO cycles. That nominal time span is assumed to provide an adequate cushion of time for maintaining a reasonably large minimum pulse width for charge (t) given the expected changes due to change in the divider value of approximately ±one DCO cycle that occurs when using a $2^{nd}$ order delta-sigma modulator to control the frequency divider. When the nominal time span of charge(t) is set to be longer than 2.5 DCO cycles through appropriate choice of $R_1C_1$ in FIG. 10 (or $1/C_1$ for a current based charge pump), the nonlinearity experienced by the Δ-Σ quantization noise will be reduced but the TVC gain will also be reduced. The nominal charging value is set to approximately half the value of $V_{reg}$ (the regulated supply voltage used to charge the capacitors based on the charge(t) signal).

Because of the narrow range of particular embodiments of the TDC structure, an augmented detection scheme may be desirable in order to reliably achieve lock conditions for the PLL. In other embodiments, the coarse phase detector may not be needed given a monotonic characteristic of the TDC.

FIG. 15B illustrates how the augmentation works in one embodiment such that a monotonically increasing error curve is achieved across the time error range of −T/2 to T/2 with the coarse phase detector output being added to the TDC output in the digital domain. If the PLL is determined to be in a phase early condition (time errors Δt less than zero), the coarse phase detector output is assumed to be negative such that the TDC output is reduced as indicated at 1203. If the PLL is determined to be in a phase late condition (time errors Δt greater than the steady-state operating range of the TDC such as Δt greater than T/4), the coarse phase detector output is assumed to be positive such that the TDC output is increased as indicated at 1205. The relative scale factors of the coarse phase detector outputs in relation to the TDC output is set such that a monotonically increasing (or decreasing for some embodiments) error characteristic is achieved from their combined output and proper settling behavior is achieved for the PLL. In the illustrated embodiment, the period (T) of the ref clock is divided into quartiles to determine when phase early and phase late occur. The quartile 1207 between 0 and T/4 is assumed to be the steady-state operating range of the TDC.

Figure 16A:
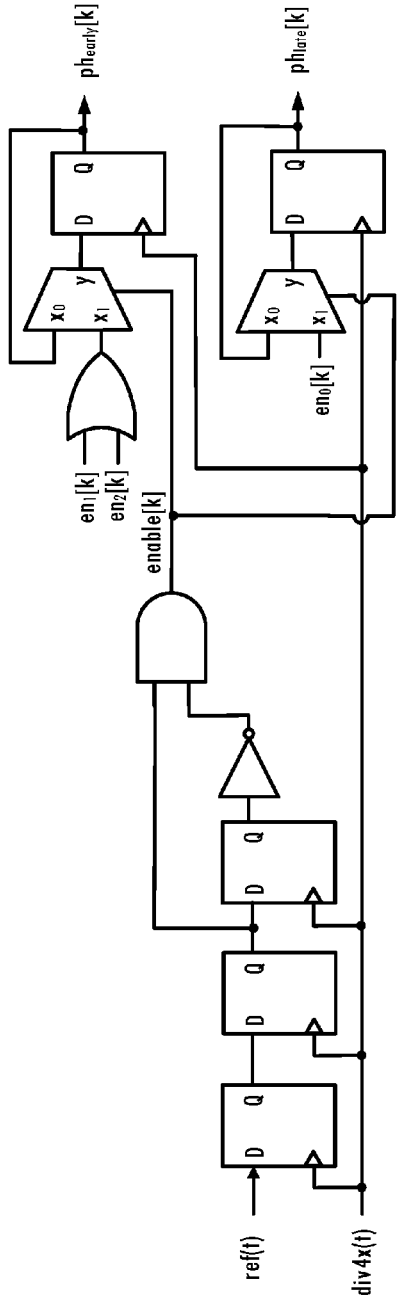
FIG. 16A illustrates an embodiment of a digital coarse phase detector circuit that determines phase early and phase late signals.
Figure 16B:
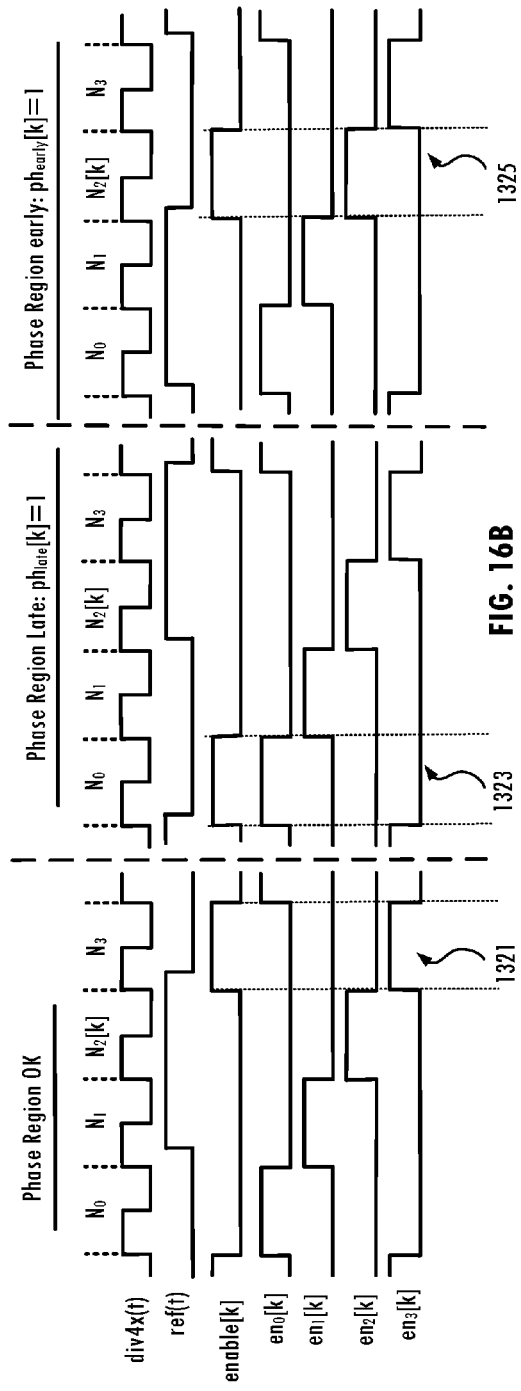
FIG. 16B illustrates a timing diagram associated with the embodiment of FIG. 13A.
Figure 17:
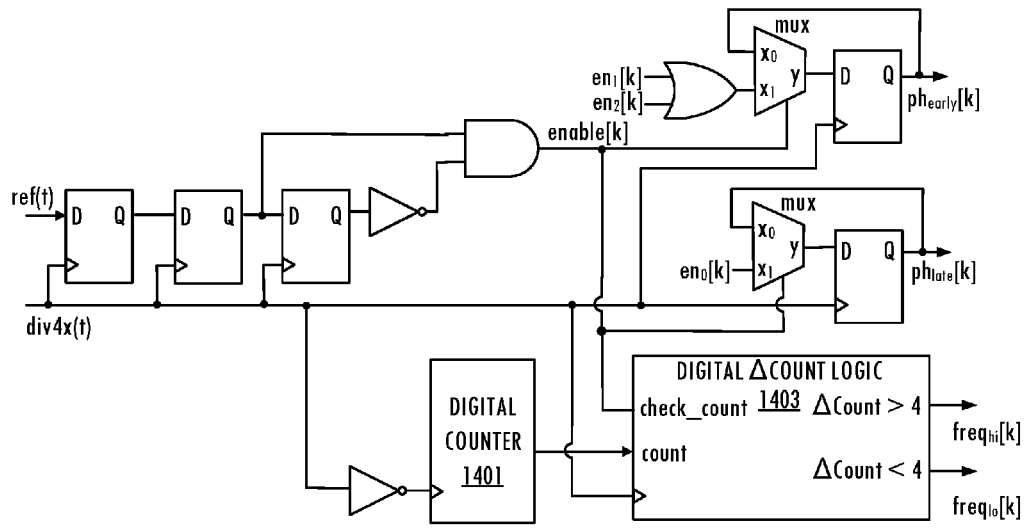
FIG. 17 illustrates an embodiment in which the coarse phase detector circuit of FIG. 16A is modified to additionally sense frequency error.

FIG. 16A illustrates an embodiment of a digital coarse phase detector circuit that determines phase early and phase late. FIG. 16B illustrates a timing diagram associated with the circuit of FIG. 16A. Referring to FIG. 16B, $en_0[k]$, $en_1[k]$, $en_2[k]$, and $en_3[k]$ correspond to the four phases of the div4×(t) divide signal. As described above, the div4×(t) corresponds to a feedback signal having a frequency that is four times that of the reference signal when the PLL is in lock. FIG. 16B illustrates the timing associated with the phase ok region 1321 corresponding to region 1207 (see FIG. 15B). The digital coarse phase detector circuit of FIG. 16A determines if the phase region is phase late in 1323 or phase early in 1325. Note that the digital coarse phase detector circuit of FIG. 16A is intrinsically active (provides an asserted $ph_{early}[k]$ or $ph_{late}[k]$ signal) only when the PLL is out of lock. FIG. 17 illustrates another embodiment in which the coarse phase detector circuit of FIG. 16A is modified to include a digital counter 1401 and digital Δ count logic 1403 to sense frequency error. When the PLL is locked there will be four div4× cycles per ref clk cycle. Greater than four div4× cycles implies that the DCO frequency is too high such that $freq_{hi}[k]$ is asserted. Less than four div4× cycles implies that the DCO frequency is too low such that $freq_{lo}[k]$ is asserted.

Figure 18A:
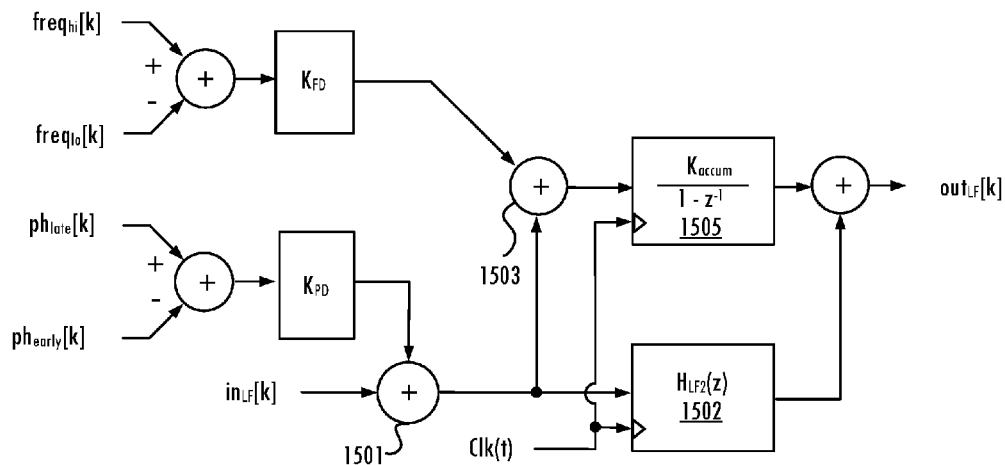
FIGS. 18A and 18B illustrate how the outputs from the digital coarse phase detector and frequency sense circuits are used to augment or adjust the output of the TDC as it is fed into an embodiment of a digital PLL loop filter after being passed through a digital compensation filter.
Figure 18B:
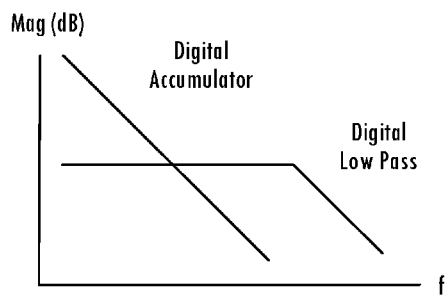

FIGS. 18A an 18B illustrate one embodiment of how the outputs from the digital coarse phase detect and frequency sense circuits are used in the loop filter to augment or adjust the output of the TDC that is supplied to the loop filter after it has been passed through a digital compensation filter. FIG. 18A shows the loop filter input $in_{LF}[k]$ adjusted in summer 1501 by a signal based on gain $K_{PD}$ and the $ph_{late}[k]$ and $ph_{early}[k]$ signals. In general, $K_{PD}$ is chosen in order achieve a monotonically increasing (or decreasing) phase error characteristic in the range of −T/2 to T/2 as shown in FIG. 18B. The adjusted signal is supplied from summer 1501 to the digital low pass filter 1502. In addition, the augmented signal is supplied to the summer 1503, where it is added to a signal based on gain $K_{FD}$ and the $freq_{hi}[k]$ and $freq_{lo}[k]$ signals (see FIG. 17). FIG. 18 illustrates that summer 1503 supplies its output to digital accumulator 1505, which is summed with the low pass filter output to generate the overall loop filter output $out_{LF}[k]$.

Additional techniques for improving performance of the phase-locked loop of FIG. 3 (e.g., techniques for generating and using frequency_error[k] and coarse_phase_error[k]

and quantization noise cancellation 317) are described in U.S. patent application Ser. No. 14/448,482, filed Jul. 31, 2014, entitled "Time-to-Digital Converter Based on a Voltage Controlled Oscillator," naming Michael H. Perrott as inventor, now U.S. Pat. No. 9,270,288, issued on Feb. 23, 2016, which application is incorporated herein by reference.

The description of the invention set forth herein is illustrative, and is not intended to limit the scope of the invention as set forth in the following claims. For example, while the invention has been described in an embodiment in which a pseudo-differential implementation of the time-to-digital converter 307 (i.e., time-to-digital converter implementation that does not sample positive and negative versions of an input signal simultaneously, which improves DC common mode rejection but not dynamic common mode rejection) is used, one of skill in the art will appreciate that the teachings herein can be utilized with a fully differential time-to-digital converter (i.e., time-to-digital converter implementation that samples positive and negative versions of an input signal simultaneously, which improves DC common mode rejection and dynamic common mode rejection) may be used. In addition, while the voltage-controlled oscillator analog-to-digital converter using input-referred offset technique has been described herein for use in a PLL application, one of skill in the art will appreciate that the teachings herein can be utilized in other applications. Accordingly, as referred to herein, complementary signal components may be differential or pseudo-differential signaling representations of a signal. Variations and modifications of the embodiments disclosed herein, may be made based on the description set forth herein, without departing from the scope of the invention as set forth in the following claims.

What is claimed is:

1. A feedback loop comprising:
an oscillator-based analog-to-digital converter configured to convert an analog signal to a first digital value and a second digital value, the oscillator-based analog-to-digital converter comprising:
a first oscillator having a first oscillation frequency configured to generate the first digital value based on a first signal component of the analog signal; and
a second oscillator having a second oscillation frequency configured to generate the second digital value based on a second signal component of the analog signal, the first and second signal components being complementary signal components; and
a combiner configured to generate a digital value based on the first digital value, the second digital value, and an offset code, the offset code having a value that increases a difference between the first oscillation frequency and the second oscillation frequency.

2. The feedback loop, as recited in claim 1, wherein the feedback loop is a phase-locked loop, the analog signal is a phase error signal, the digital value corresponds to the phase error signal, and the first and second oscillators are voltage-controlled oscillators.

3. The feedback loop, as recited in claim 1, wherein the combiner comprises:
a first summing node configured to combine the first digital value and the second digital value to generate a single-ended digital value; and
a second summing node configured to combine the single-ended digital value and the offset code to generate the digital value.

4. The feedback loop, as recited in claim 1, further comprising:
a time-to-digital converter comprising:
a phase detector configured to generate an output phase difference signal based on an input clock signal and a feedback clock signal;
a time-to-voltage converter configured to convert the output phase difference signal to a first voltage signal and a second voltage signal, the first voltage signal and the second voltage signal comprising a differential signaling representation of the analog signal; and
the oscillator-based analog-to-digital converter.

5. The feedback loop, as recited in claim 4, wherein the output phase difference signal is a charge control signal corresponding to a phase error between the input clock signal and the feedback clock signal and the time-to-voltage converter comprises:
a first resistor-based charge pump circuit to generate the first signal component of the analog signal according to the charge control signal; and
a second resistor-based charge pump circuit to generate the second signal component of the analog signal according to the charge control signal.

6. The feedback loop, as recited in claim 4, further comprising:
a loop filter configured to generate a control signal based on the digital value;
a controllable oscillator configured to generate an output clock signal having a frequency responsive to the control signal; and
a feedback divider configured to generate the feedback clock signal based on the output clock signal.

7. The feedback loop, as recited in claim 1, wherein the offset code introduces a first offset voltage to the first signal component and the offset code introduces a second offset voltage to the second signal component.

8. The feedback loop, as recited in claim 1, wherein the offset code corresponds to an input-referred offset of the oscillator-based analog-to-digital converter having a level at least half of an input range of the oscillator-based analog-to-digital converter.

9. The feedback loop, as recited in claim 1,
wherein the first oscillator comprises a first ring oscillator and first tuning transistors coupling stages of the first ring oscillator to a first supply node and second tuning transistors coupling the stages of the first ring oscillator to a second supply node, and
wherein the second oscillator comprises a second ring oscillator and third tuning transistors coupling stages of the second ring oscillator to the first supply node and fourth tuning transistors coupling the stages of the second ring oscillator to the second supply node.

10. The feedback loop, as recited in claim 9, wherein the oscillator-based analog-to-digital converter further comprises:
first transition counter to count first transitions in the first ring oscillator and to supply a first digital value based on the first transitions; and
a second transition counter to count second transitions in the second ring oscillator and to supply a second digital value based on the second transitions, the first and second digital values being complementary digital values.

11. A method of operating a feedback loop comprising:
generating a first digital value and a second digital value using an oscillator-based analog-to-digital converter; and
generating a digital signal based on the first digital value, the second digital value, and an offset code, the offset code having a value that increases a frequency difference between a first frequency of oscillation of a first oscillator of the oscillator-based analog-to-digital converter and a second frequency of oscillation of a second oscillator of the oscillator-based analog-to-digital converter.

12. The method, as recited in claim 11, further comprising:
generating an output phase difference signal based on an input clock signal and a feedback clock signal; and
converting the output phase difference signal to an analog signal having a first signal component corresponding to a positive representation of the output phase difference signal and a second signal component corresponding to a negative representation of the output phase difference signal;
generating a first oscillating signal having the first frequency of oscillation using the first signal component; and
generating a second oscillating signal having the second frequency of oscillation using the second signal component.

13. The method, as recited in claim 12,
wherein generating the first oscillating signal comprises tuning a first ring oscillator of the oscillator-based analog-to-digital converter to oscillate at the first frequency using the first signal component; and
wherein generating the second oscillating signal comprises tuning a second ring oscillator of the oscillator-based analog-to-digital converter to oscillate at the second frequency using the second signal component.

14. The method, as recited in claim 12, further comprising:
counting transitions of the first oscillating signal to determine the first digital value; and
counting transitions of the second oscillating signal to determine the second digital value.

15. The method, as recited in claim 12, wherein the offset code introduces a first voltage offset to the first signal component and the offset code introduces a second voltage offset voltage to the second signal component.

16. The method, as recited in claim 11, wherein the offset code corresponds to an input-referred offset of the oscillator-based analog-to-digital converter having a level at least half of an input range of the oscillator-based analog-to-digital converter.

17. The method, as recited in claim 13, wherein the offset code reduces occurrence of injection-locking of the first ring oscillator to the second ring oscillator.

18. A method of operating a phase-locked loop comprising:
converting, using a first charge pump, a phase error corresponding to a time difference between a reference signal and a feedback signal of the phase-locked loop to a first voltage signal corresponding to a positive representation of the phase error;
converting, using a second charge pump, the phase error to a second voltage signal corresponding to a negative representation of the phase error;
supplying the first voltage signal to tune a first ring oscillator to thereby control a first oscillation frequency of the first ring oscillator and supplying the second voltage signal to tune a second ring oscillator to thereby control a second oscillation frequency of the second ring oscillator; and
generating a digital value corresponding to the phase error based on a first digital code indicative of the first oscillation frequency, a second digital code indicative of the second oscillation frequency, and an offset code having a value that increases a difference between the first oscillation frequency and the second oscillation frequency.

19. The method, as recited in claim 18, wherein the offset code introduces a first voltage offset to the first voltage signal and introduces a second voltage offset to the second voltage signal.

20. The method, as recited in claim 18, wherein the offset code corresponds to a level at least half of an input range of an oscillator-based analog-to-digital converter including the first ring oscillator and the second ring oscillator.

* * * * *